United States Patent
Takeuchi (10) Patent No.: US 8,116,345 B2
(45) Date of Patent: Feb. 14, 2012

(54) SURFACE EMITTING LASER AND IMAGE FORMING APPARATUS

(75) Inventor: Tetsuya Takeuchi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/370,094

(22) Filed: Feb. 12, 2009

(65) Prior Publication Data

US 2009/0213889 A1    Aug. 27, 2009

(30) Foreign Application Priority Data

Feb. 22, 2008 (JP) ................................. 2008-041488

(51) Int. Cl.
*H01S 5/00* (2006.01)

(52) U.S. Cl. .................. 372/50.124; 372/50.11; 399/58

(58) Field of Classification Search ............. 372/50.124
See application file for complete search history.

(56) References Cited

U.S. PATENT DOCUMENTS

| | | | | |
|---|---|---|---|---|
| 6,035,153 A * | 3/2000 | Yamawaki et al. | ............. | 399/58 |
| 2003/0235229 A1* | 12/2003 | Deng et al. | ...................... | 372/96 |
| 2005/0213629 A1* | 9/2005 | Takahashi | .................. | 372/50.11 |
| 2007/0131950 A1 | 6/2007 | Takeuchi | ........................ | 257/93 |
| 2008/0056320 A1 | 3/2008 | Takeuchi | .................... | 372/45.01 |
| 2009/0080489 A1 | 3/2009 | Uchida et al. | ............ | 372/50.124 |
| 2009/0135872 A1 | 5/2009 | Uchida et al. | ............ | 372/50.124 |
| 2009/0135876 A1 | 5/2009 | Takeuchi et al. | ........... | 372/50.11 |

FOREIGN PATENT DOCUMENTS

JP    06-224405 A    8/1994

OTHER PUBLICATIONS

D.I. Babic et al., "Analytic Expressions for the Reflection Delay, Penetration Depth, and Absorptance of Quarter-Wave Dielectric Mirrors," IEEE Journal of Quantum Electronics, vol. 28, No. 2, pp. 514-524, Feb. 1992.

H.J. Unold et al., "Improving Single-Mode VCSEL Performance by Introducing a Long Monolithic Cavity," IEEE Photonics Technology Letters, vol. 12, No. 8, 939-941, Aug. 2000.

* cited by examiner

*Primary Examiner* — Jessica Stultz
*Assistant Examiner* — Xnning Niu
(74) *Attorney, Agent, or Firm* — Fitzpatrick, Cella, Harper & Scinto (57) ABSTRACT

A surface emitting laser includes first mirror, a second mirror, and an active layer formed between the first mirror and the second mirror. A third mirror is formed between the first mirror and the active layer. A first cavity is constituted by the first mirror and the second mirror, and a second cavity is constituted by the first mirror and the third mirror.

5 Claims, 9 Drawing Sheets

SURFACE EMITTING LASER AND IMAGE FORMING APPARATUS

BACKGROUND OF THE INVENTION

1. Field of the Invention

The present invention relates to a surface emitting laser, particularly a vertical cavity surface emitting laser, and to an image forming apparatus using the surface emitting laser.

2. Description of the Related Art

A vertical cavity surface emitting laser (VCSEL) is one type of surface emitting laser. Because light can be emitted in a direction perpendicular to the principal plane of a semiconductor substrate in this type of laser, a two-dimensional array can be easily formed. Parallel processing of multiple beams emitted from the two-dimensional array can provide higher resolution and higher speed, and various industrial applications are expected to be achievable. For example, when a surface emitting laser array is used as an exposure light source of an electrophotographic printer, higher resolution printing and higher printing speed can be achieved through the use of parallel processing of multiple beams in a printing step. However, because minute spots are formed on a photoconductor drum with laser beams during electrophotographic printing, laser beams with a single transverse mode are required.

In recent years, a method for forming a current confinement structure by selectively oxidizing, for example, AlGaAs having an Al content of about 98% has been introduced for a surface emitting laser. This reduces the amount of unnecessary leakage-current and significantly improves light-emitting efficiency.

However, a selectively oxidized structure may not be appropriate in consideration of the single transverse mode. This is because oxidized layers cause a large refractive index difference and a higher order transverse mode may also exist stably. In particular, when a light-emitting area is enlarged to a diameter of 10 μm or more to achieve a higher output, even higher order transverse mode oscillation may occur.

Thus, single transverse mode oscillation is normally achieved by decreasing the diameter of the current confinement portion in the oxidized confinement structure to about 3 μm.

However, such a small diameter of the current confinement portion decreases the light-emitting area, which significantly reduces an output per element. Because current is injected into a minute light-emitting region, the resistance of an element is considerably increased. When current is injected into an element with higher resistance, the temperature increases and gain may decrease.

Some methods for achieving single transverse mode oscillation while maintaining a rather large light-emitting area, by intentionally introducing a loss difference between a fundamental transverse mode and a higher order transverse mode, have been considered.

One such method is to achieve single transverse mode oscillation by increasing the cavity length so as to increase diffraction loss of high order transverse modes, which is described in IEEE Photonics Technology Letters, Vol. 12, No. 8, 2000, p. 939. In this document, a long cavity structure is formed by disposing a GaAs layer with a thickness of 4 μm or more in a cavity to achieve a high-output single transverse mode in a surface emitting laser having a wavelength of 980 nm. This long cavity structure increases diffraction loss of high order transverse modes, and a single transverse mode can oscillate even in a relatively large light-emitting area (diameter of 7 μm).

However, the inventors of the present invention described herein found that the long cavity structure described in IEEE Photonics Technology Letters, Vol. 12, No. 8, 2000, p. 939, provides multi-longitudinal mode oscillation, which hardly occurs in known VCSELs.

In a one-wavelength cavity used in a surface emitting laser, a small cavity length of about 0.3 μm causes a longitudinal mode spacing of 50 nm or more, whereby a single longitudinal mode operation is easily achieved.

In a structure where a spacer layer having a thickness of 2 to 10 μm is inserted into a cavity, the longitudinal mode spacing decreases to about 10 nm. As the amount of current injection is increased to obtain a desired optical output, the gain peak shifts to longer wavelengths due to heat. As a result, the longitudinal mode hops to the next mode at longer wavelengths.

Figure 11:
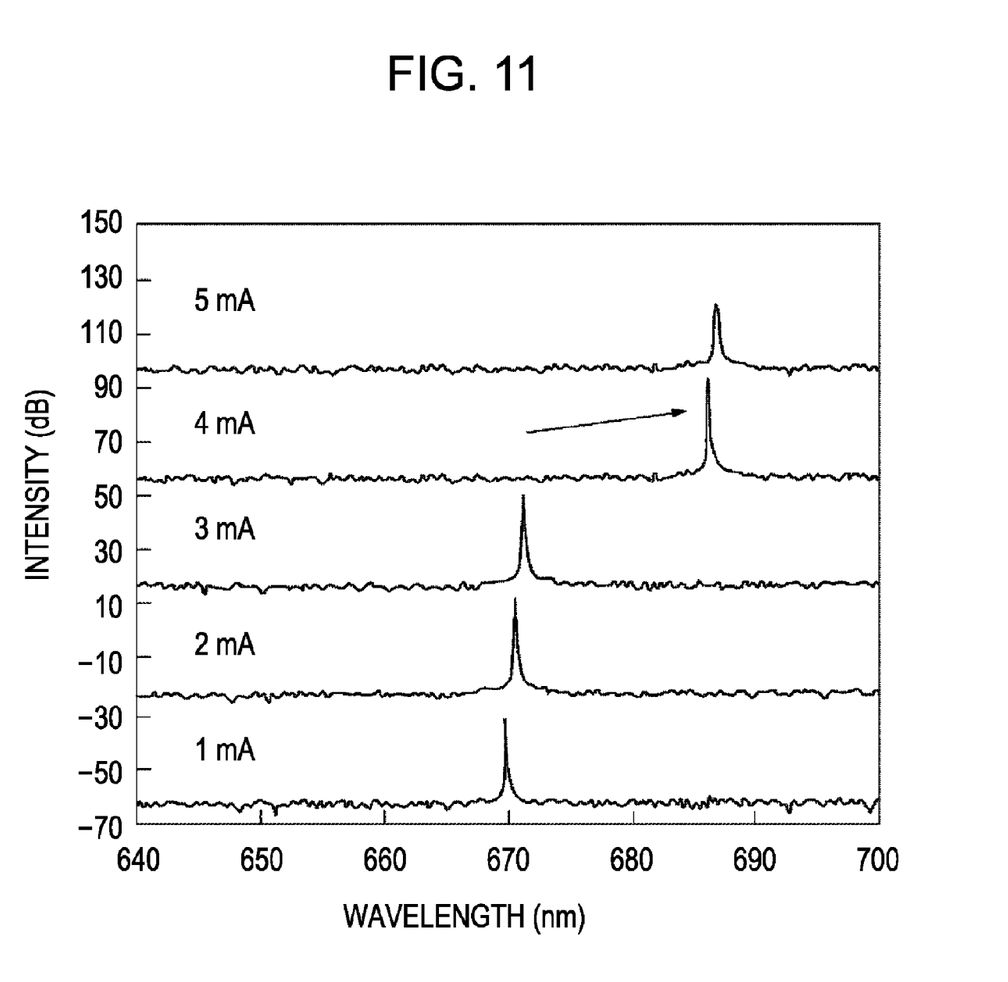
FIG. 11 is a graph showing multi-longitudinal mode oscillation in a surface emitting laser having a known long cavity structure.

FIG. 11 shows examples of results from a surface emitting laser in which longitudinal mode hopping is demonstrated in an experiment conducted by the inventors. In this experiment, a spacer layer having a thickness of 2 μm was inserted into a cavity and a desired resonant wavelength was assumed to be 670 nm. As shown in FIG. 11, the surface emitting laser oscillates at the desired wavelength in cases where the amount of current injection is small, that is, 3 mA or less. However, the longitudinal mode hops to the next resonant mode of 685 nm in cases where the amount of current injection is increased to 4 mA or more to provide more optical output.

When the longitudinal mode hops in such a manner, emission intensity or a far-field pattern becomes unstable. For example, such longitudinal mode hopping is inappropriate for a light source of an apparatus that is required to stably form a beam spot, such as a photolithographic exposure apparatus.

In terms of parameters of crystal growth, including thickness control and surface roughness caused by an increase in cavity length, forming thick cladding layers having a thickness of several micrometers to achieve a long cavity structure should be avoided.

SUMMARY OF THE INVENTION

Aspects of the present invention provide a surface emitting laser that solves the problems described above and is suitable for oscillating in a single longitudinal mode and a single transverse mode, and also provide an image forming apparatus using the surface emitting laser.

A surface emitting laser according to an aspect of the present invention includes a cavity including a first mirror and a second mirror, wherein, in each of the first and second mirrors, first layers with a first refractive index and second layers with a second refractive index higher than the first refractive index are alternately stacked; an active layer formed in the cavity; and a third mirror formed between the first mirror and the active layer, the third mirror having a structure in which third layers with a third refractive index lower than the second refractive index and fourth layers with a fourth refractive index higher than the third refractive index and the first refractive index are alternately stacked. In the surface emitting laser, when a first adjacent layer that is included in the first mirror and is closest to the third mirror is one of the first layers, a second adjacent layer that is included in the third mirror and is closest to the first mirror is one of the third layers; and when the first adjacent layer is one of the second layers, the second adjacent layer is one of the fourth layers.

With aspects of the present invention, a surface emitting laser that is suitable for oscillating in a single longitudinal mode and a single transverse mode, and an image forming apparatus using the surface emitting laser can be provided.

Further features of the present invention will become apparent from the following description of exemplary embodiments with reference to the attached drawings.

DESCRIPTION OF THE EMBODIMENTS

According to embodiments of the present invention, a surface emitting laser having a physically thin but optically thick structure functions as a long cavity. A detailed structure of the laser will be described hereinafter.

Figure 1A:
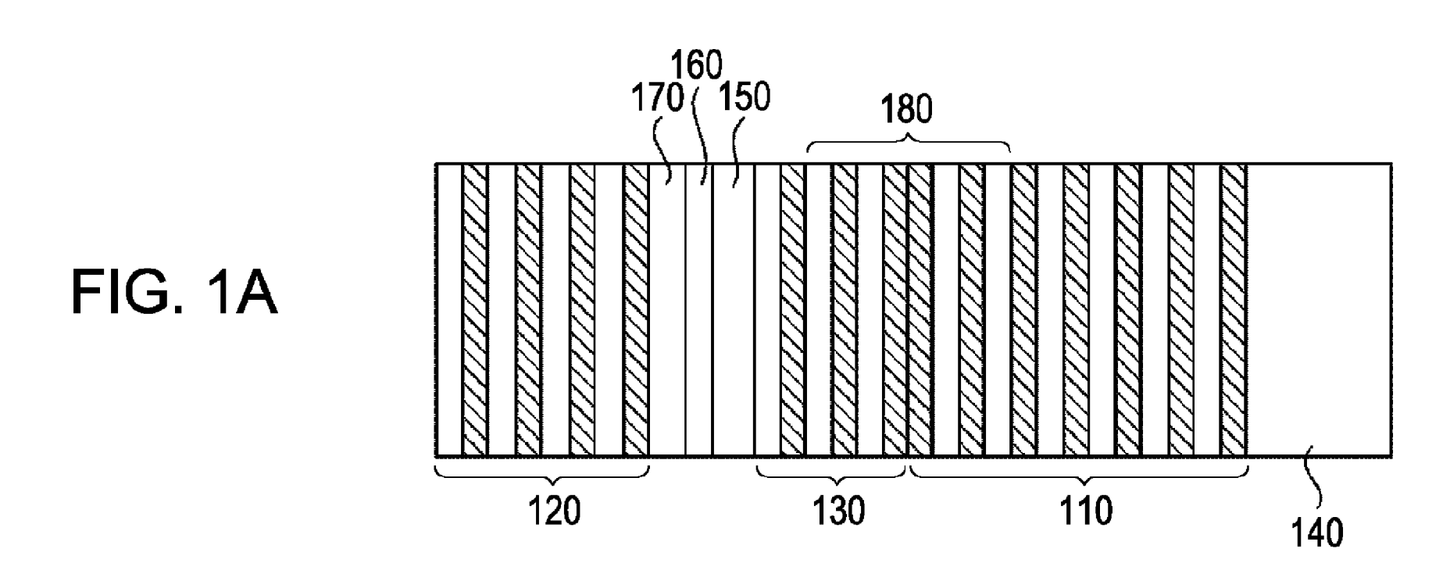
FIG. 1A is a schematic sectional view showing a structure, according to an embodiment of the present invention.

FIG. 1A is a schematic sectional view showing a surface emitting laser according to an embodiment of the present invention. A first mirror 110 constituted by multiple layers, a third mirror 130, a lower cladding layer 150, an active layer 160, an upper cladding layer 170, and a second mirror 120 constituted by multiple layers are stacked on a substrate 140 in sequence. The lower cladding layer 150 and the upper cladding layer 170 sandwich the active layer 160.

Figure 2:
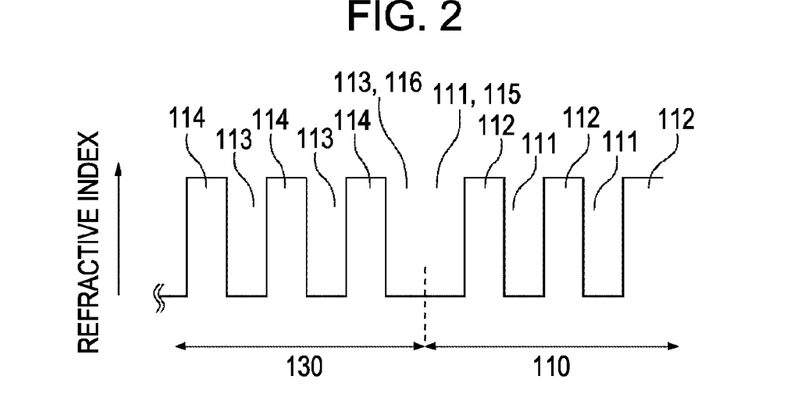
FIG. 2 is a schematic view showing a portion of the structure shown in FIG. 1A and a relationship between the structure and refractive indices thereof, according to an embodiment of the present invention.

The first mirror 110 and the second mirror 120, which are positioned so as to sandwich the active layer 160, form a cavity structure (a first cavity). For example, the first mirror 110 and the second mirror 120 have high refractive index layers and low refractive index layers that are alternately arranged so as to be axisymmetric about the active layer 160. FIG. 2 is an enlarged schematic view showing a portion of the structure shown in FIG. 1A denoted by reference numeral 180. Layers of the third mirror 130 and the first mirror 110 are plotted on the abscissa and refractive indices are plotted on the ordinate. Some of the layers of the first mirror 110 and the third mirror 130 are suitably omitted.

The first mirror 110 has a structure in which first layers 111 (low refractive index layers) with a first refractive index (a low refractive index) and second layers 112 (high refractive index layers) with a second refractive index (a high refractive index) higher than the first refractive index are alternately stacked.

In general, the low refractive index layers and the high refractive index layers, each having an optical thickness of $\lambda/4$, that constitute a distributed Bragg-reflector (DBR) are alternately stacked, where $\lambda$ is a wavelength of light emitted from the surface emitting laser. The optical thickness is determined by multiplying the thickness of a layer by the refractive index of a material of the layer.

The optical thickness of each of the first layers 111 and the second layers 112 is not necessarily $\lambda/4$. The total optical thickness of the first layers 111 and the second layers 112 may be an integral multiple of $\lambda/2$.

The third mirror 130 has a structure in which third layers 113 (low refractive index layers) and fourth layers 114 (high refractive index layers) are alternately stacked. The third layers 113 have a third refractive index (a low refractive index) lower than the second refractive index. The fourth layers 114 have a fourth refractive index (a high refractive index) higher than the third refractive index and the first refractive index. In FIG. 2, the refractive indices of the first layers 111 and the third layers 113 are the same and the refractive indices of the second layers 112 and the fourth layers 114 are also the same.

Normally, the low refractive index layers and the high refractive index layers in the third mirror 130, each having an optical thickness of $\lambda/4$, are also alternately stacked as in the first mirror 110.

In this embodiment of the present invention, a first adjacent layer 115 is in contact with a second adjacent layer 116. The first adjacent layer 115 is a layer included in the first mirror 110 that is closest to the third mirror 130. The second adjacent layer 116 is a layer included in the third mirror 130 that is closest to the first mirror 110. Another layer can be disposed between the first adjacent layer 115 and the second adjacent layer 116.

Figure 1B:
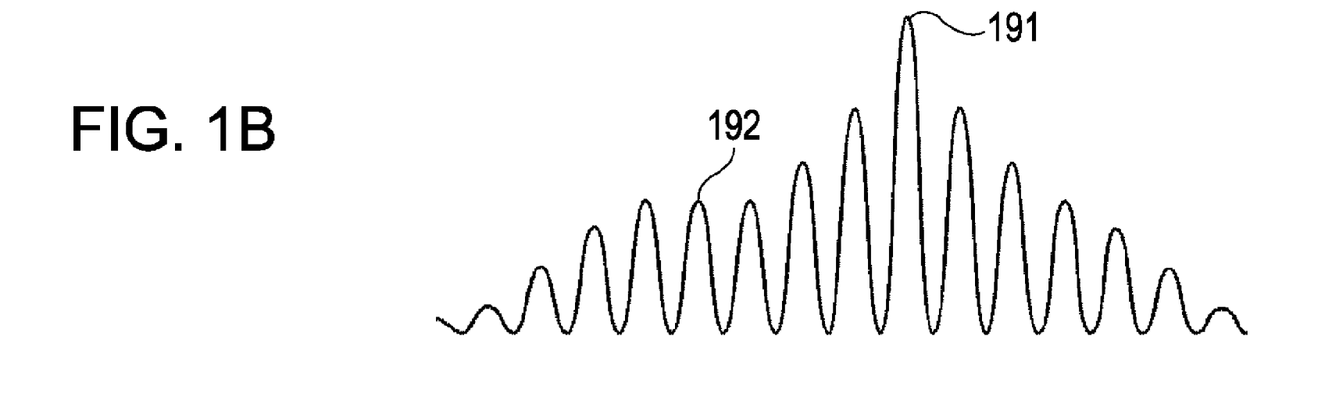
FIG. 1B shows an example of an internal light intensity of the structure shown in FIG. 1A.

As described above, the first mirror 110 and the second mirror 120, which oppose each other, form a cavity (a first cavity). The first mirror 110 and the third mirror 130, which also have such a similar structure, form a cavity (a second cavity). In other words, the first cavity includes the second cavity different from the first one. FIG. 1B schematically shows a light intensity distribution inside an element structure of FIG. 1A. As is clear from the drawing, light is confined most strongly between the first mirror 110 and the third mirror 130 in the structure described above. That is to say, the maximum intensity (reference numeral 191) of the internal light intensity distribution between the first mirror 110 and the third mirror 130 is larger than the internal light intensity (reference numeral 192) in the active layer 160. Thus, a structure having a large effective cavity length is realized.

In a case where a DBR constituted by layers with an optical thickness of $\lambda/4$ of a design wavelength is used, the DBR does not function as a cavity at a wavelength other than the design wavelength and light is not confined in a cavity. This means that a long cavity structure is formed only when a wavelength close to the design wavelength is adopted. As a result, since a longitudinal mode substantially occurs only at the design wavelength, a single longitudinal mode can be achieved.

In this embodiment of the present invention, as described above, a cavity has a physically thin but optically thick structure, whereby a single transverse mode is achieved. Furthermore, such a structure limits formation of longitudinal modes, which achieves single longitudinal mode oscillation.

Figure 3:
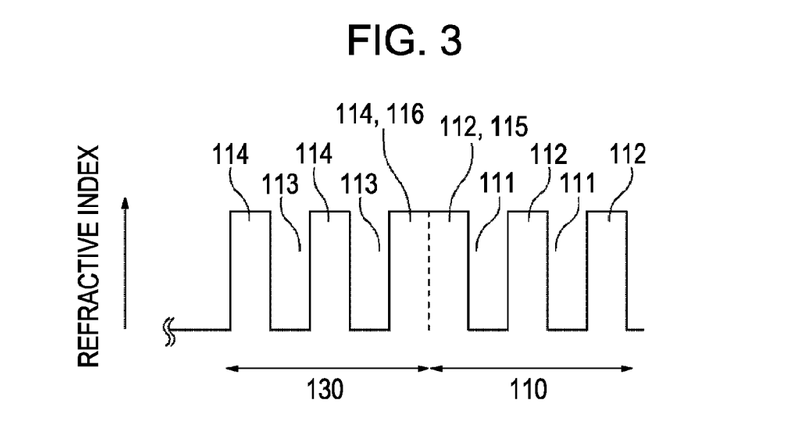
FIG. 3 is a schematic view showing a portion of a structure and a relationship between the structure and refractive indices thereof, according to an embodiment of the present invention.

FIG. 3 shows another embodiment according to the present invention. As in FIG. 2, layers of the third mirror 130 and the first mirror 110 are plotted on the abscissa and refractive indices are plotted on the ordinate. The structure shown in FIG. 3 is the same as that shown in FIG. 2 except for a structure in which the first adjacent layer 115 and the second adjacent layer 116 are high refractive layers. The same components as in FIG. 2 are designated by the same reference numerals. The first adjacent layer 115 and the second adjacent layer 116 may be low refractive layers, as shown in FIG. 2, or high refractive layers, as shown in FIG. 3.

Figure 4:
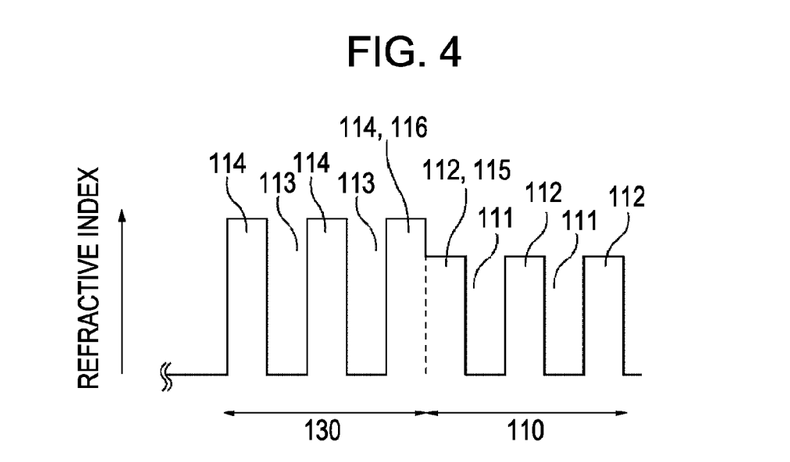
FIG. 4 is a schematic view showing a portion of a structure and a relationship between the structure and refractive indices thereof, according to an embodiment of the present invention.

FIG. 4 shows a relationship between a structure and refractive indices thereof, in which the refractive index of the second layers 112 that constitute the first mirror 110 is different from that of the fourth layers 114 that constitute the third mirror 130. The refractive index of the first adjacent layer 115 may be different from that of the second adjacent layer 116.

Similarly, the refractive index of the first layers 111 (low refractive index layers) that constitute the first mirror 110 may be different from that of the third layers 113 (low refractive index layers) that constitute the third mirror 130.

Although the second mirror 120 shown in FIG. 1A is a multilayer mirror (DBR), a photonic crystal in which light resonates in the in-plane direction may be used as the second mirror 120.

The first mirror 110 and the third mirror 130 shown in FIG. 1A are disposed closer to the substrate 140 side than the active layer 160, but may be disposed on the side remote from the substrate 140.

In consideration of reflectivity necessary for oscillation, a fourth mirror may be suitably disposed between the first mirror 110 and the active layer 160 or between the third mirror 130 and the substrate 140.

EXAMPLES

Example 1

A red surface emitting laser will be described as an example according to an embodiment of the present invention.

In a surface emitting laser where a DBR is used as a mirror, the effective cavity length is determined in accordance not with the physical thickness of layers constituting the surface emitting laser but with a phase change of reflected light or a light intensity distribution when light leaks to DBR layers. Although there is a slight difference in values between methods based on the phase change of reflected light and the light intensity distribution, the difference is not important (refer to IEEE Journal of Quantum Electronics, Vol. 28, No. 2, 1992, p514). Aspects of the present invention will be described by considering the two methods separately.

Figure 5A:
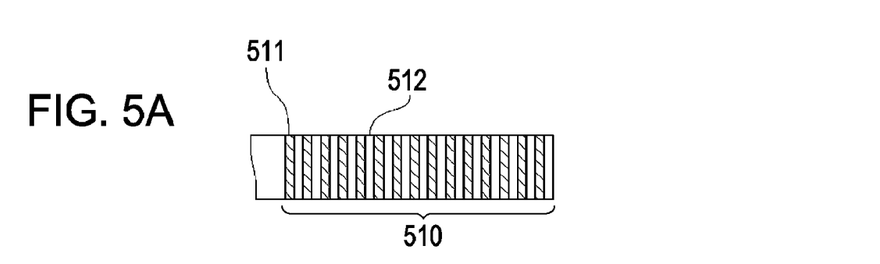
FIGS. 5A to 5C respectively show three structures of a known short cavity, a known long cavity, and an example according to an embodiment of the present invention for explaining EXAMPLE 1.
Figure 5B:
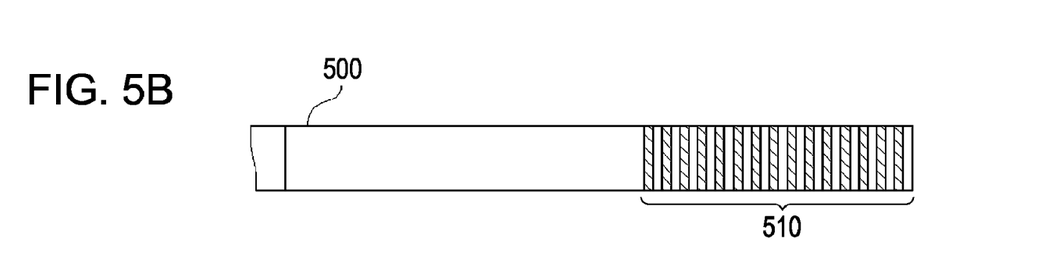
Figure 5C:
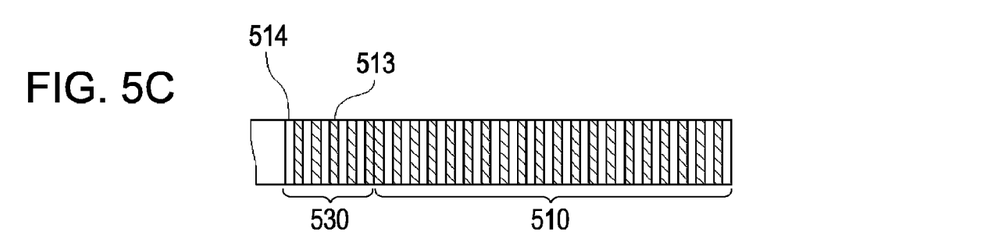

The distance at which light leaks to DBR layers or the like is taken into account. FIGS. 5A to 5C show three structures.

In a first case, only a DBR (a first DBR 510) including 60 pairs of AlAs 511 and $Al_{0.5}Ga_{0.5}As$ 512 with an optical thickness of $\lambda/4$ is disposed (FIG. 5A).

In a second case, an $Al_{0.7}Ga_{0.3}As$ layer (single layer 500) having a thickness of 4.2 μm is in contact with the first DBR 510 (FIG. 5B).

In a third case, a multilayer structure including the first DBR 510 and a third DBR 530 is formed (FIG. 5C).

In the third case, the third DBR 530 includes 8.5 pairs and the first DBR 510 includes 68.5 pairs. The number of pairs of the first DBR 510 is increased by 8.5 pairs that are the same number of pairs as the third DBR 530.

An $Al_{0.7}Ga_{0.3}As$ layer is selected as the single layer 500 in the second case. A thickness of 4.2 μm corresponds to 19 wavelengths.

The multilayer structure in the third case includes the first DBR 510 and the third DBR 530. The layers of the third DBR 530 have the same composition as those of the first DBR 510, that is, AlAs 513 and $Al_{0.5}Ga_{0.5}As$ 514. However, the third DBR 530 and the first DBR 510 have high refractive index layers and low refractive index layers alternating in opposite directions to form a cavity.

In other words, a cavity with a length of $\lambda/2$ is formed at a position where the first DBR 510 is in contact with the third DBR 530. In this case, the material of the layers at that contact position is AlAs, which has a low refractive index. This relationship between structure and refractive index corresponds to the relationship shown in FIG. 2.

In EXAMPLE 1, the number of pairs of the first DBR 510 is increased by the number of the pairs of the third DBR 530. The purpose is to maintain the same reflectivity observed from the active layer side, that is, the left side of FIGS. 5A to 5C, as in the case of the original 60 pairs by cancelling out the effect of the third DBR 530. This structure provides the same reflectivity as the first DBR 510 optimized in terms of the original element design, and the multilayer structure of EXAMPLE 1 does not cause a reflection loss.

Furthermore, optical absorption in the multilayer structure needs to be suppressed to a minimum extent to prevent the deterioration of device characteristics due to the multilayer structure, such as an increase in a threshold current or a decrease in an optical output. Because the free carrier absorption of an n-type carrier is generally low and the mobility is high compared with a p-type carrier, the multilayer structure can be formed on the n side so as to be of an n-type. This can sufficiently suppress optical absorption and prevent a significant increase in resistance. In addition, for example, the amount of doping is increased at positions to be nodes of a light intensity distribution to suppress an increase in resistance at heterointerfaces of the multilayer structure to a minimum extent. As a result, optical absorption can be suppressed while resistance can be reduced.

Figure 6A:
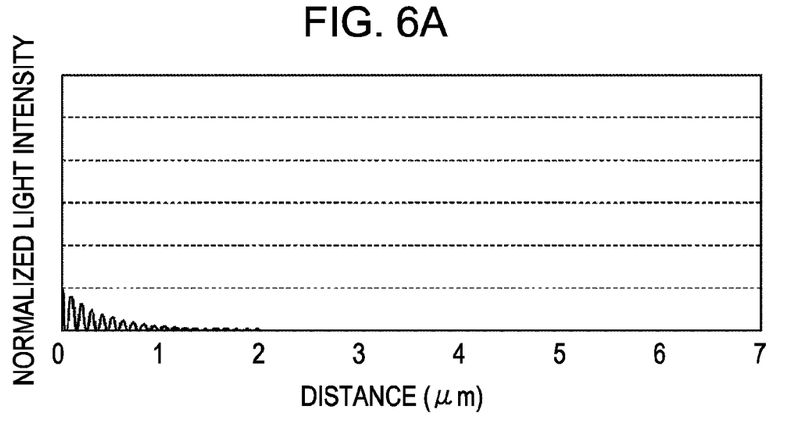
FIGS. 6A to 6C respectively show relationships between internal light intensity and distance in three structures of a known short cavity, a known long cavity, and an example according to an embodiment of the present invention.
Figure 6B:
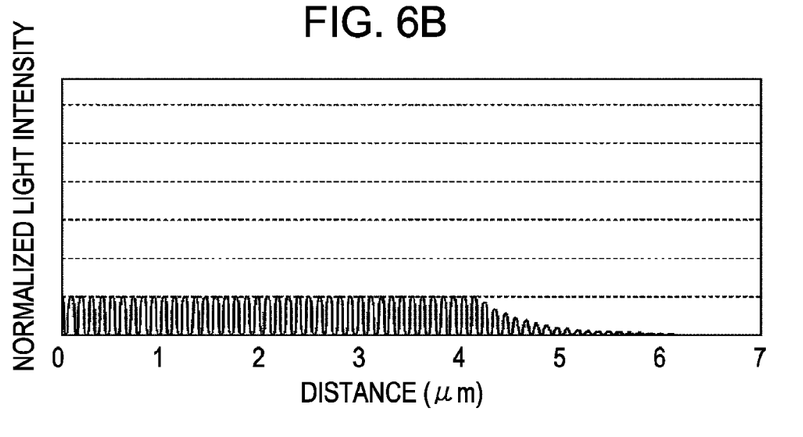
Figure 6C:
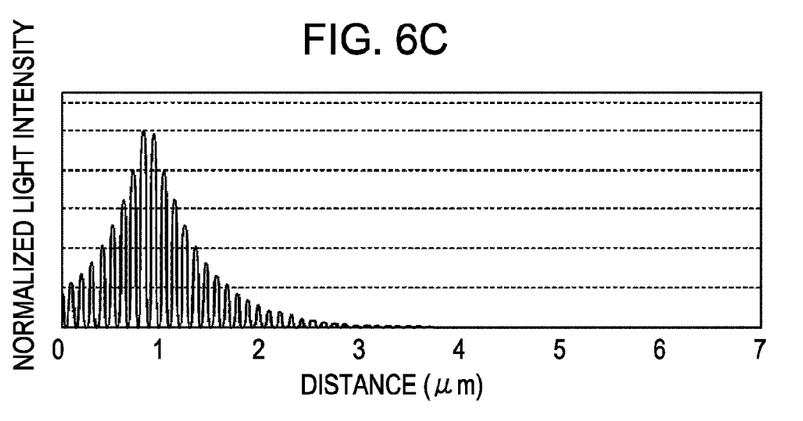

FIGS. 6A to 6C respectively show three internal light intensity distributions in the DBRs of the three cases. The first case is shown in FIG. 6A. It is obvious that light leaks to the DBR, whereby the effective cavity length is larger than the physical cavity length (one-wavelength cavity). The contribution of leaking of light to the cavity length is 0.5 μm on the basis of a calculation.

The light intensity distribution of the second case is shown in FIG. 6B. A thickness of 4.2 μm of the $Al_{0.7}Ga_{0.3}As$ layer is added to the length due to leaking of light. Thus, the contribution of leaking of light to the cavity length in the second case is 4.7 μm in total.

Finally, the light intensity distribution of the third case is shown in FIG. 6C. As evident from the drawing, the light intensity distribution includes a significantly high intensity region due to provision of the multilayer structure shown in FIG. 5C. The region corresponds to the cavity structure formed by the first DBR and the third DBR. In the third case, although the physical cavity length is 1.8 μm, which is less than half the length of the second case (B), the contribution of leaking of light to the cavity length is 5.0 μm on the basis of a calculation. In other words, aspects of the present invention can provide an effective optical length of 5.0 μm that is more than twice a physical length of 1.8 μm in this EXAMPLE.

Thus, an effective cavity length can be increased more than by an increment in a physical thickness of the structure.

Figure 7:
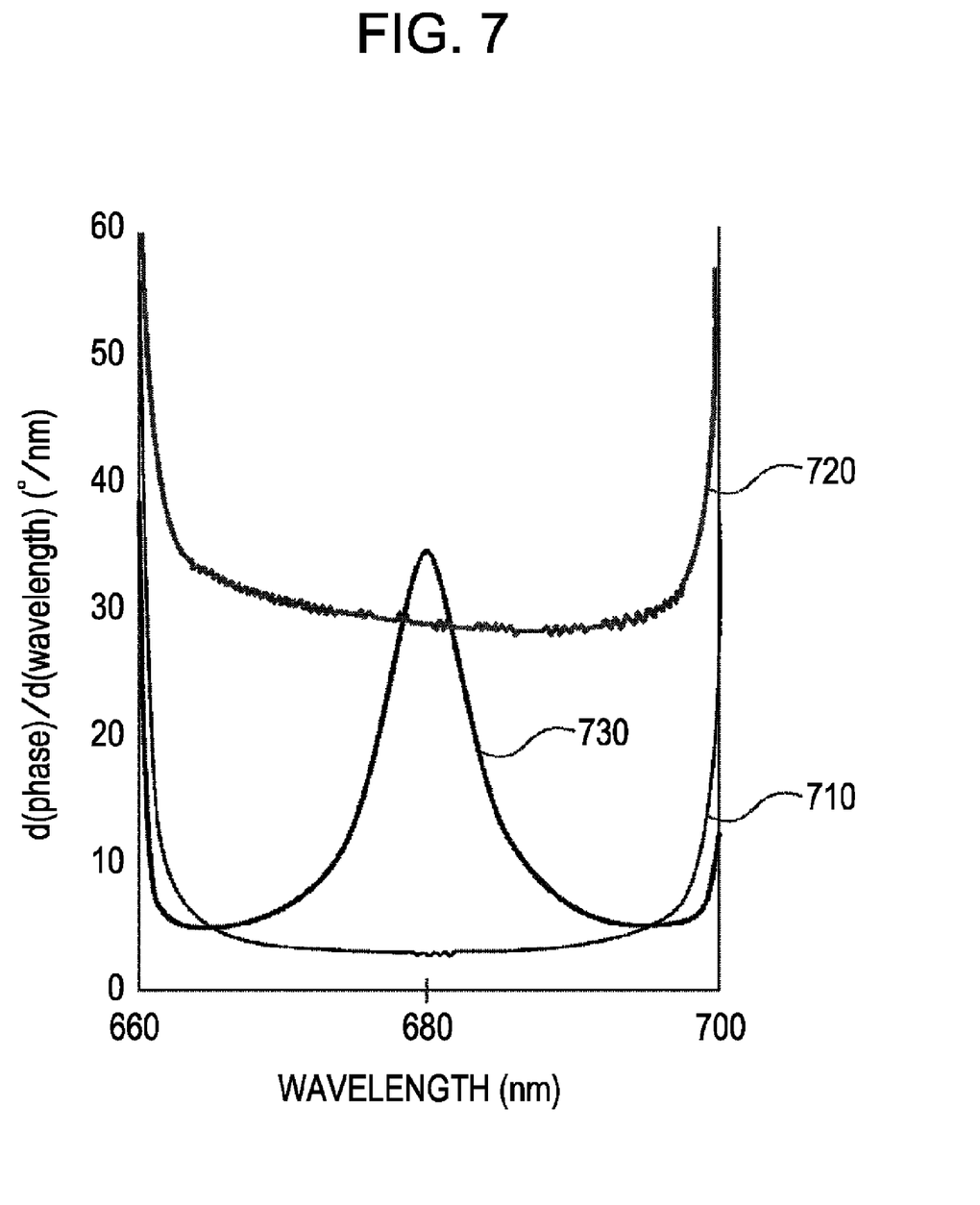
FIG. 7 is a graph showing a phase change of reflected light in the three structures shown in FIGS. 5A to 5C.

FIG. 7 shows a result regarding a phase change of reflected light.

To consider a phase change of reflected light, a phase change per unit length is determined by also considering a differential value of phase with respect to wavelength, that is, a refractive index. As denoted by reference numeral 710, the phase change of a known short cavity (one-wavelength cavity) is 5°/nm or less within a stop bandwidth (about 30 nm in this case).

As denoted by reference numeral 720, the phase changes by about 30°/nm in a known structure in which a spacer layer having a thickness of 4.2 μm is inserted to form a long cavity structure. This means that light returns after propagating over a long distance. However, because the phase change hardly depends on wavelength within a stop bandwidth, a long cavity structure is formed for a wavelength other than a design wavelength, which causes oscillation in a longitudinal mode other than a desired longitudinal mode as shown in FIG. 11.

In the structure according to this EXAMPLE as denoted by reference numeral 730, on the other hand, a phase change is sharp only at a design wavelength (680 nm), which is substantially the same degree of phase change as in the known long cavity. At a wavelength other than the design wavelength, the phase change is as low as that of the short cavity even within a stop bandwidth. In other words, since the cavity functions only at the design wavelength, a long cavity structure is not formed. Accordingly, there are no longitudinal modes except for a desired longitudinal mode, whereby problems such as longitudinal mode hopping do not arise and a single longitudinal mode can be achieved.

A process for manufacturing an element of a wafer in which the multilayer structure is disposed in a layered-structure of surface emitting laser will now be described.

Figure 8:
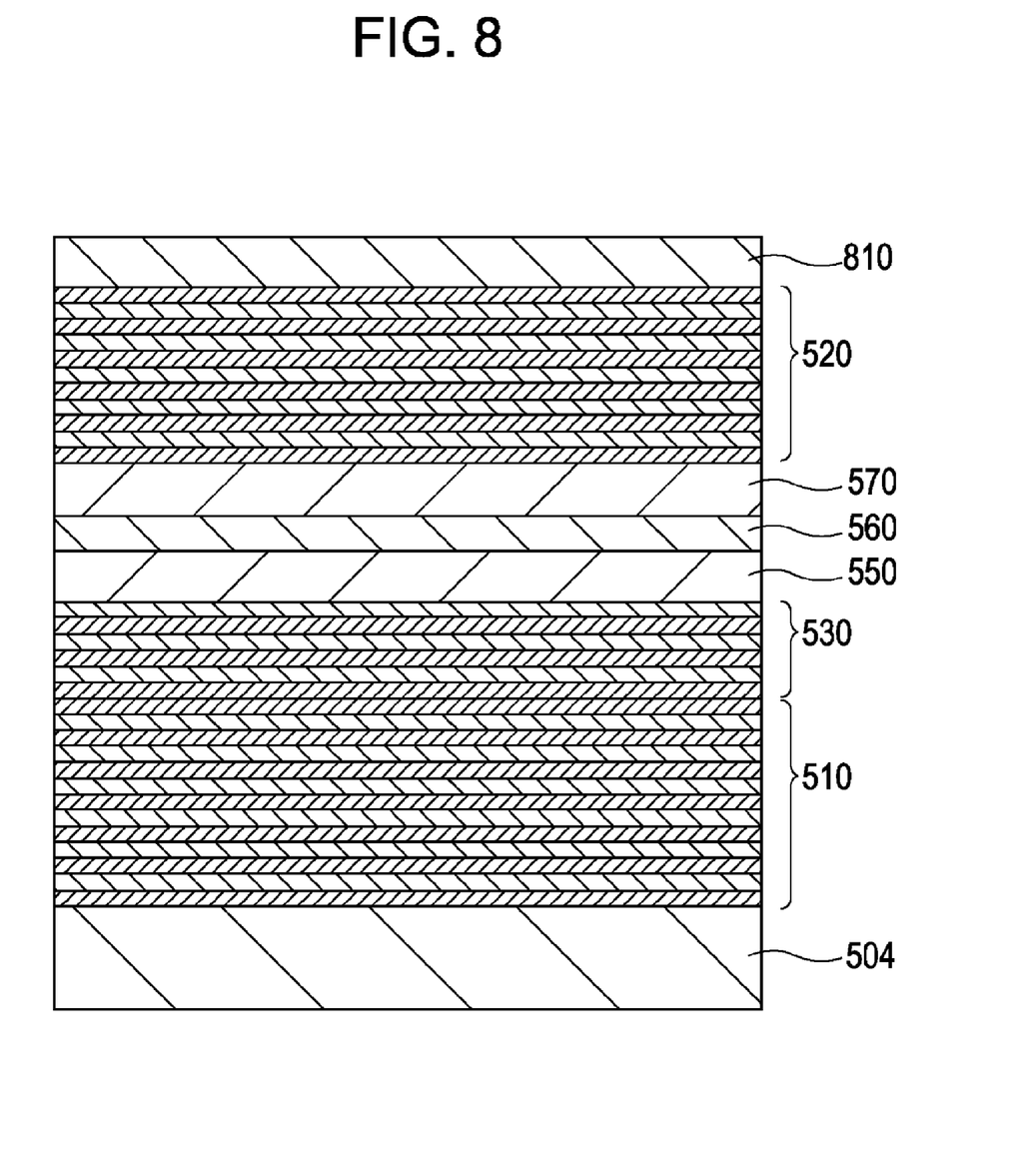
FIG. 8 is a schematic sectional view of a wafer in EXAMPLE 1.

FIG. 8 shows the layered-structure. An n-type first DBR 510 and an n-type third DBR 530, which are composed of AlAs and $Al_{0.5}Ga_{0.5}As$, are stacked as a lower reflecting mirror on an n-type GaAs substrate 504. Such a layered-structure is formed by metal-organic chemical vapor deposition (MOCVD) or molecular beam epitaxy (MBE).

Subsequently, on the layered-structure, an n-type lower cladding layer 550 composed of $Al_{0.35}Ga_{0.15}In_{0.5}P$, a quantum-well active layer 560 composed of $Ga_{0.56}In_{0.44}P/Al_{0.25}Ga_{0.25}In_{0.5}$, and a p-type upper cladding layer 570 composed of $Al_{0.5}In_{0.5}P$ are stacked in sequence.

A p-type second DBR 520 composed of $Al_{0.9}Ga_{0.1}As$ and $Al_{0.5}Ga_{0.5}As$ is stacked as an upper reflecting mirror on the upper cladding layer 570, and a p-type GaAs contact layer 810 is stacked on the second DBR 520.

Figure 9:
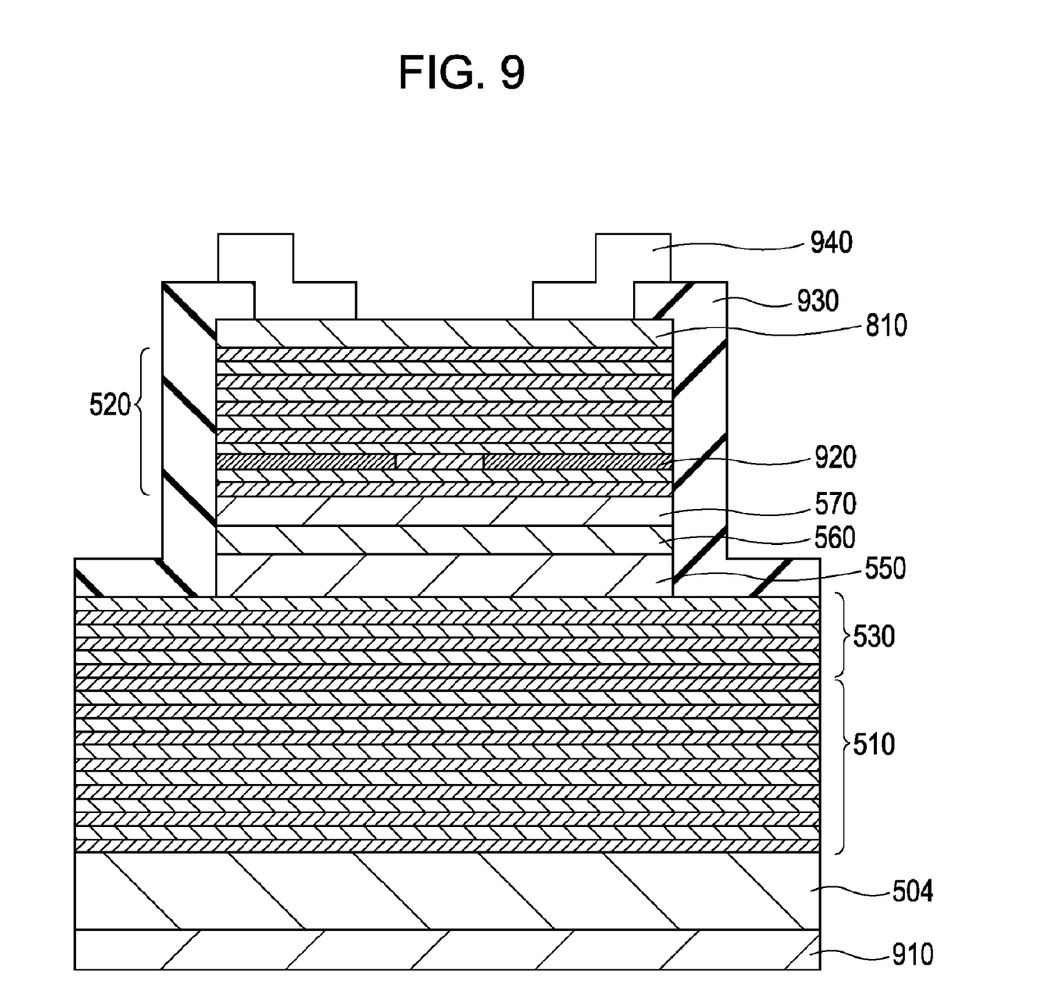
FIG. 9 is a schematic sectional view of an element in EXAMPLE 1.

An element shown in FIG. 9 is then manufactured. First, a post shape is formed by etching the wafer. The etching is carried out up to a layer (n-type layer in this case) having a conduction-type different from that of a surface layer (p-type layer in this case), that is, the n-type third DBR 530, to ensure sufficient isolation. The wafer is then selectively oxidized in a water vapor atmosphere to form a current confinement structure 920. An insulating film 930 composed of, for example, $SiO_2$ is deposited, and $SiO_2$ formed on the upper side of the wafer is removed by photolithography and wet etching. Subsequently, a p-side electrode 940 and a pad are formed with Ti/Au by liftoff. AuGe/Ni/Au is deposited as an n-side electrode 910 on the back of the n-type GaAs substrate 504, and the element is completed by annealing the wafer at 400° C. for several minutes.

Example 2

Figure 10:
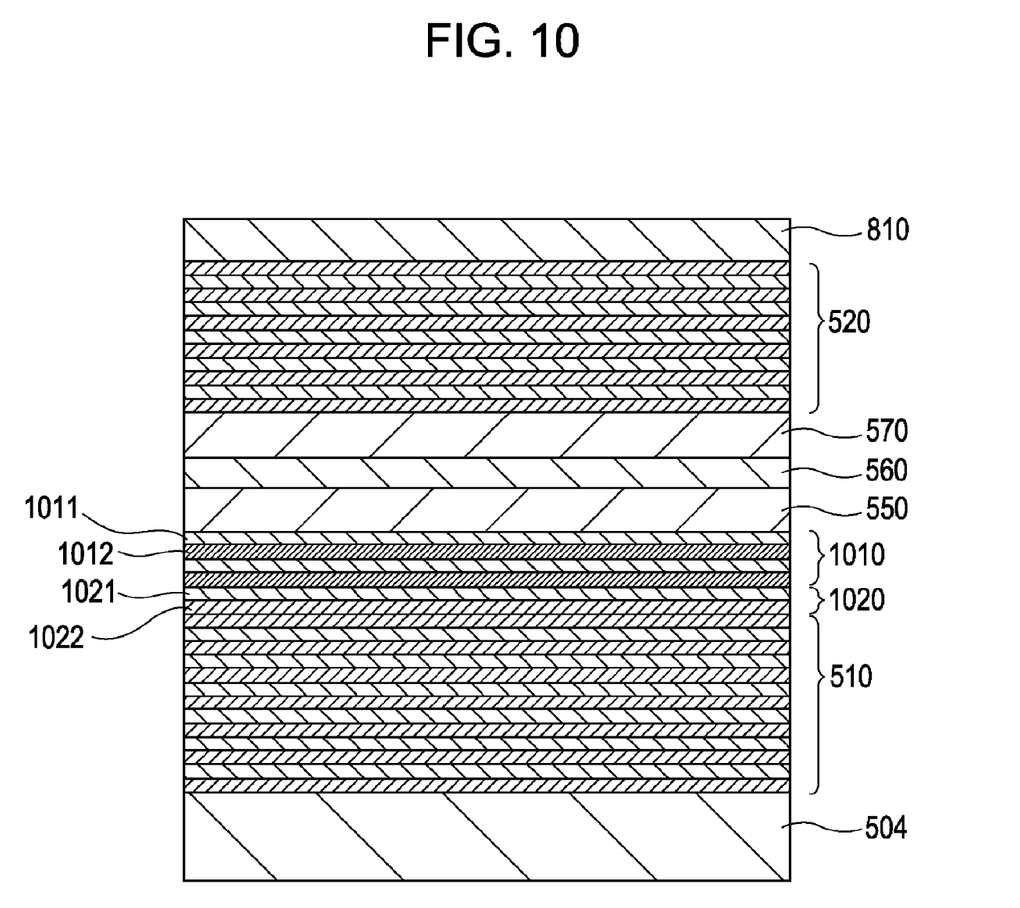
FIG. 10 is a schematic sectional view of a wafer in EXAMPLE 2.

In this EXAMPLE, as shown in FIG. 10, the third DBR 530 described in EXAMPLE 1 is divided into a fourth DBR 1010 and a fifth DBR 1020. The same reference numerals as in FIG. 9 denote the same components.

The fourth DBR 1010 includes 4 pairs of $Al_{0.5}Ga_{0.5}As$ layers 1011 (high refractive index layers) and $Al_{0.9}Ga_{0.1}As$ layers 1012 (low refractive index layers). The fifth DBR 1020 includes 4.5 pairs of $Al_{0.5}Ga_{0.5}As$ layers 1021 (high refractive index layers) and AlAs layers 1022 (low refractive index layers). Some pairs are suitably omitted in FIG. 10.

The fourth DBR 1010 and the fifth DBR 1020 are disposed so as to oppose the first DBR 510. As a result, a contact region between the first DBR 510 and the second DBR 1020 functions as a cavity and light is strongly confined.

When a wafer is etched to just below the active layer for isolation, by disposing the fourth DBR 1010 that does not include easily oxidizable AlAS just below the active layer, AlAs is less likely to be exposed.

In this example of the present invention, it is important that high refractive index layers and low refractive index layers of DBRs inserted to confine light are properly arranged. Thus, a material used for DBRs can be suitably selected.

Because the above two EXAMPLES have been described by taking an example of a red surface emitting laser, attention has been mainly focused on AlGaAs as a material. However, the present invention is not limited to AlGaAs, but is applicable to group III-V or II-VI semiconductors such as AlGaInN, AlGaInP, AlGaInAsP, AlGaAsSb, and BeZnCdMgSSe, which are light-emitting materials.

Example 3

In this EXAMPLE, a surface emitting laser according to an aspect of the present invention that is used as a light source of an image forming apparatus will be described. The image forming apparatus includes a photo conductor, a charging unit configured to charge the photo conductor, a light-irradiation unit configured to irradiate the charged photo conductor with light, a developing unit configured to develop an electrostatic latent image formed by light-irradiation.

The photo conductor, which is uniformly charged with the charging unit, is irradiated with a laser beam emitted from a surface emitting laser according to an embodiment of the present invention that is an exposure light source, through a polygonal mirror or a condensing lens that is an optical path changing unit. After the photo conductor is irradiated with the laser beam, the charged state disappears at the irradiated part of the photo conductor and the electrostatic latent image is formed. Toner is supplied, with the developing unit, to the photo conductor where the electrostatic latent image has been formed, to form a toner image. The toner image is then transferred to a transfer material such as paper.

Although aspects of the present invention have been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2008-041488 filed Feb. 22, 2008, which is hereby incorporated by reference herein in its entirety.

What is claimed is:
1. A surface emitting laser comprising:
   a first mirror;
   a second mirror;
   an active layer formed between the first mirror and the second mirror; and a third mirror disposed between the first mirror and the active layer, wherein a first cavity is constituted by the first mirror and the second mirror, and a second cavity is constituted by the first mirror and the third mirror, wherein the first mirror, the second mirror, and the third mirror are multilayer mirrors having high refractive index layers and low refractive index layers that are alternately arranged, wherein, when the layer closest to the active layer in the second mirror is a high refractive index layer, the layer closest to the active layer in the third mirror is a low refractive index layer, and wherein, when the layer closest to the active layer in the second mirror is a low refractive index layer, the layer closest to the active layer in the third mirror is a high refractive index layer.

2. The surface emitting laser according to claim 1, wherein the first mirror and the third mirror each include an n-type semiconductor.

3. The surface emitting laser according to claim 1, wherein the first mirror is a lower reflecting mirror disposed between the active layer and a substrate.

4. The surface emitting laser according to claim 1, wherein a number of pairs in the first mirror is larger than that of the second mirror.

5. The surface emitting laser according to claim 1, wherein the surface emitting laser is incorporated in an image forming apparatus that includes:
  a photo-conductor;
  a charging unit configured to charge the photo-conductor;
  a light-irradiation unit configured to form an electrostatic latent image on the charged photo-conductor; and
  a developing unit configured to develop the electrostatic latent image formed with the light-irradiation unit,
  wherein the surface emitting laser is used as a light source of the light-irradiation unit.

* * * * *